United States Patent
Radke

(10) Patent No.: US 6,586,984 B1
(45) Date of Patent: Jul. 1, 2003

(54) METHOD FOR PREVENTING DAMAGE TO IO DEVICES DUE TO OVER VOLTAGE AT PIN

(75) Inventor: Russell E. Radke, Fort Collins, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/194,271

(22) Filed: Jul. 12, 2002

(51) Int. Cl.[7] ................................. H03K 5/08
(52) U.S. Cl. ...................... 327/309; 327/72; 327/77
(58) Field of Search ....................... 327/72, 77, 78, 327/81, 88, 89, 309, 321, 319; 361/91.1, 91.2

(56) References Cited

U.S. PATENT DOCUMENTS

| | | | | |
|---|---|---|---|---|
| 4,524,351 A | * | 6/1985 | Kimura et al. | 340/629 |
| 5,378,936 A | * | 1/1995 | Kokubo et al. | 327/77 |
| 5,488,324 A | * | 1/1996 | Mizuta et al. | 327/77 |
| 5,942,921 A | * | 8/1999 | Talaga, Jr. | 327/77 |
| 6,008,674 A | * | 12/1999 | Wada et al. | 327/89 |
| 6,124,732 A | * | 9/2000 | Zilic et al. | 326/63 |

* cited by examiner

Primary Examiner—Tuan T. Lam
(74) Attorney, Agent, or Firm—Trexler, Bushnell, Giangiorgi, Blackstone & Marr Ltd.

(57) ABSTRACT

A circuit which provides that a source voltage and a pad voltage are band-limited and source-followed down in order to get them into the input range of a comparator, the output of which signals an over-voltage condition on the pad. The circuit provides the ability to provide the relationship between the source voltage and pad voltage to a comparator with a very small, tightly-controlled offset. This translates to the ability to detect very small over-voltage conditions on an IO. The circuit consumes little power, is highly accurate, and requires no special, expensive process options. The circuit can be used anywhere there is a desire to compare (with a small, accurate offset) two signals that are close to a source voltage, such as VDD. The circuit can also be used to compare signals close to VSS.

8 Claims, 1 Drawing Sheet

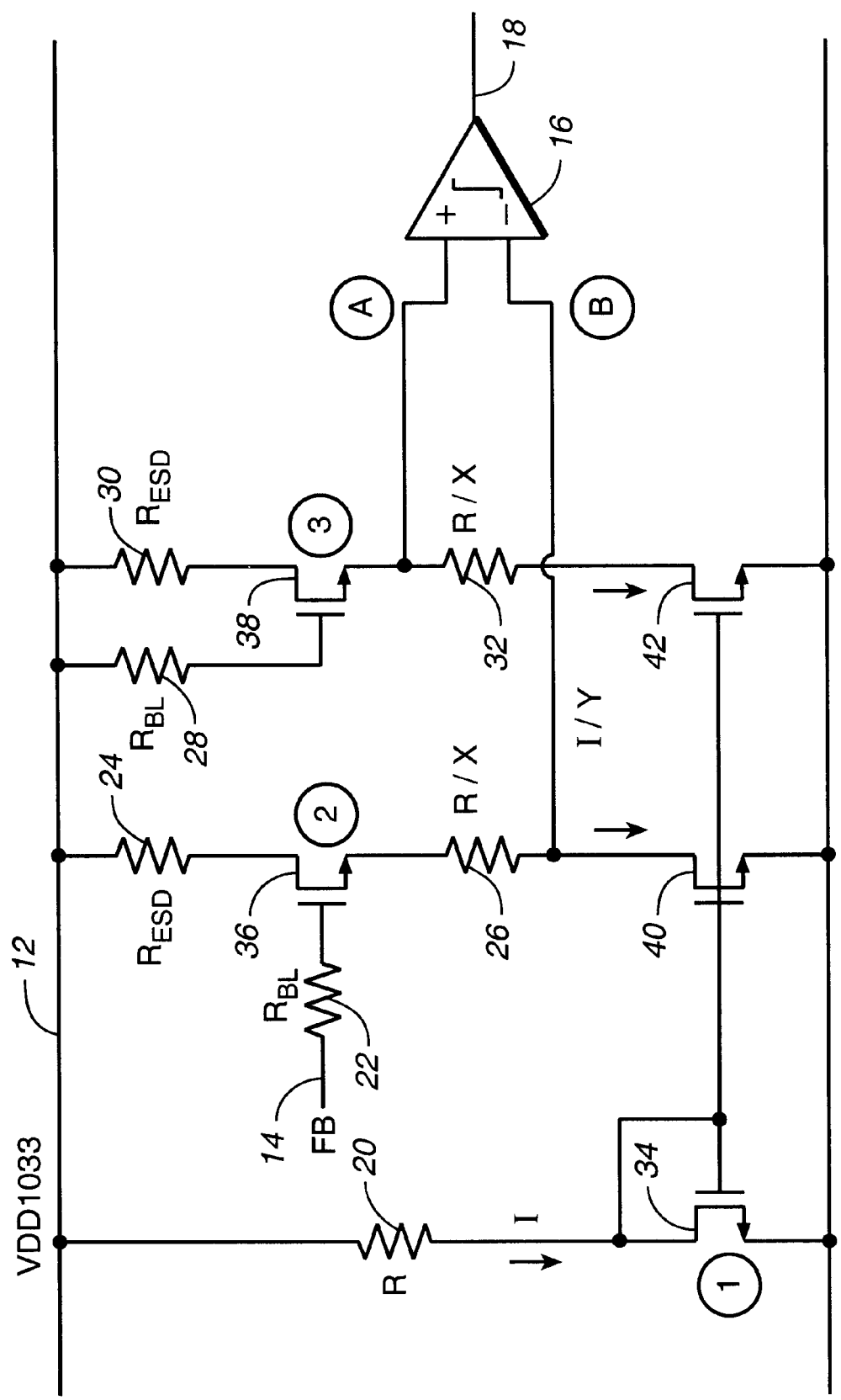
FIG._1

US 6,586,984 B1

METHOD FOR PREVENTING DAMAGE TO IO DEVICES DUE TO OVER VOLTAGE AT PIN

BACKGROUND

The present invention generally relates to methods and apparatuses for preventing damage to IO devices due to over voltage at pin, and more specifically relates to a method and apparatus for preventing damage to IO devices by band-limiting and source-following and using a comparator to signal a relatively small over-voltage condition on the pad.

Chips are often subject to over-voltage conditions at their input/outputs (IO's). A common method of protecting the IO's of a chip is to detect large over-voltage conditions, such as in the range of a thick-gate MOS device's Vt (i.e., 0.5–0.7 volt). Oftentimes, this amount of protection (i.e., being able to detect a 0.5–0.7 volt over-voltage condition) is not enough to adequately protect the IO's of the chip. It would be beneficial to be able to detect over-voltage conditions which are not quite as high, such as a 0.1 volt over-voltage condition at pin in order to more fully protect IO devices from being damaged as a result of an over voltage condition at pin.

OBJECTS AND SUMMARY

A general object of an embodiment of the present invention is to provide a method and apparatus for detecting a relatively small over-voltage condition at pin, such as a 0.1 volt over voltage, thereby preventing damage to IO devices due to over voltage at pin.

Another object of an embodiment of the present invention is to provide a method and apparatus where voltage levels are band-limited and source-followed, and a comparator is used to signal an over-voltage condition on the pin of an IO device.

Briefly, and in accordance with at least one of the foregoing objects, an embodiment of the present invention provides a method and circuit which provides that a source voltage and a pad voltage are band-limited and source-followed down in order to get them into the input range of a comparator, the output of which signals an over-voltage condition on the pad. The circuit provides the ability to provide the relationship between the source voltage and pad voltage to a comparator with a very small, tightly-controlled offset. This translates to the ability to detect very small over-voltage conditions on an IO. The circuit consumes little power, is highly accurate, and requires no special, expensive process options. The circuit can be used anywhere there is a desire to compare (with a small, accurate offset) two signals that are close to a source voltage, such as VDD. The circuit can also be used to compare signals close to VSS.

BRIEF DESCRIPTION OF THE DRAWINGS

The organization and manner of the structure and operation of the invention, together with further objects and advantages thereof, may best be understood by reference to the following description, taken in connection with the accompanying drawing, wherein FIG. 1 illustrates a circuit which is in accordance with an embodiment of the present invention and is configured to detect a relatively small over voltage condition at the pin of an IO device.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

FIG. 1 depicts a circuit IO which is in accordance with an embodiment of the present invention. The circuit IO provides that a source voltage 12 and a pad voltage 14 are band-limited and source-followed down in order to get them into the input range of a comparator 16, the output 18 of which signals an over-voltage condition on the pad. The circuit 10 provides the ability to provide the relationship between the source voltage 12 and pad voltage 14 to a comparator 16 with a very small, tightly-controlled offset. This translates to the ability to detect very small over-voltage conditions on an IO. The circuit 10 consumes little power, is highly accurate, and requires no special, expensive process options. The circuit 10 can be used anywhere there is a desire to compare (with a small, accurate offset) two signals that are close to a source voltage, such as VDD. The circuit 10 can also be used to compare signals close to VSS.

As shown in FIG. 1, the circuit 10 is configured to receive a source voltage 12 ("VDDIO33") and a pad voltage 14 ("FB"). The circuit 10 includes resistors 20, 22, 24, 26, 28, 30, 32, field effect transistors 34, 36, 38, 40, 42 and a comparator 16. The circuit 10 is configured to band-limit and source-follow down both the source voltage 12 and pad voltage 14, and effectively use the comparator 16 to compare the two voltages to determine whether an over-voltage condition exists.

Preferably, each of the field effect transistors 34, 36, 38, 40, 42 in the circuit is sized to remain in saturation with the supplied biasing. With regard to the resistors, resistor 20 ("R" in FIG. 1) may be 92 KOhms, resistors 24, 30 ("$R_{ESD}$" in FIG. 1) may be 100 Ohms each, and band-limiting resistors 22, 28 ("$R_{BL}$" in FIG. 1) may be 100 Kohms. With regard to the "R/X" resistors shown in FIG. 1 (i.e., resistors 26, 32, X may be 23, in which case each of the R/X resistors will be 4 KOhms. The resistors will all vary +/–20% or so across process, voltage and temperature (PVT). While the variation is high, they will all vary together, and their matching will be on the order of 1%. The matching of I to I/Y is also on the order of 1%, so the voltage drop across the R/X resistors 26, 32 will match very well. Additionally, Y may be 2, in which case I/Y will be one half of the value of current I. Since the source voltage 12 ("VDDIO33") only has a 5% variation,and the Vgs of field effect transistor 34 is small with respect to the source voltage 12 ("VDDIO33"), the product V=(I/Y)*(R/X) will only vary around 8%. This is a desirable, tight distribution on the target threshold.

The resistor 26 below the source-follower 36 on the FB side drops the source-followed version of FB an additional offset lower (=(I*R)/(X*Y)) to set the amount that FB must be higher than the source voltage 12 ("VDDIO33") by in order to signal an over-voltage condition on output 18. This additional voltage can be set very small without fear of large variations across process, voltage and temperature (PVT) due to the fact that I is inversely proportional to R, and all other variations are relatively small.

Hence, I=(VDD−($V_{T1}$+$V_{DSAT1}$))/R, and the voltages supplied to comparator 16 are VDD−($V_{T3}$+$V_{DSAT3}$) at node A, and FB−($V_{T2}$+$V_{DSAT2}$)−(I*R)/(X*Y) at node B. So, the voltage at node A will be V=(I/Y)*(R/X) higher than the voltage at node B when FB=VDDIO33 (i.e., when the pad voltage 14 equals the source voltage 12). This means that the pad voltage 14 ("FB") will have to get more than V=(I/Y)

*(R/X) higher than the source voltage 12 ("VDDIO33") for the comparator 16 to trip.

The circuit 10 is configured to provide that the source voltage 12 and pad voltage 14 are band-limited and source-followed down in order to get them into the input range of comparator 16, the output 18 of which signals an over-voltage condition on the pad. The circuit 10 provides the ability to provide the relationship between the source voltage 12 and pad voltage 14 to the comparator 16 with a very small, tightly-controlled offset. This translates to the ability to detect very small over-voltage conditions on an IO.

While an embodiment of the present invention is shown and described, it is envisioned that those skilled in the art may devise various modifications of the present invention without departing from the spirit and scope of the appended claims.

What is claimed is:

1. A circuit configured to receive a source voltage and a pad voltage, said circuit comprising: a first input for receiving the source voltage; a second input for receiving the pad voltage; at least one band-limiting resistor connected to the first input and having a resistance which provides that said at least one band-limiting resistor band-limits the source voltage; at least one band-limiting resistor connected to the second input and having a resistance which provides that said at least one band-limiting resistor band-limits the pad voltage; at least one source-follower transistor connected to the first input to source-follow down the source voltage; at least one source-follower transistor connected to the second input to source-follow down the pad voltage; a comparator which receives said source voltage and said pad voltage and compares the two to determine when an over-voltage condition exists; and at least one resistor connected to the source-follower transistor which is connected to the second input and having a resistance which provides that an offset is introduced to said pad voltage before said pad voltage is provided to said comparator.

2. A circuit as defined in claim 1, wherein said circuit is configured such that said comparator will trip only when the pad voltage exceeds the source voltage by a value which is more then said offset which is introduced to said pad voltage.

3. A circuit as defined in claim 1, wherein said source voltage is 3.3 volts and wherein each of said band-limiting resistors is 100 kOhms.

4. A circuit as defined in claim 1, wherein each of said source-follower transistors is sized to remain in saturation with supplied biasing.

5. A method of determining whether an over-voltage condition exists on a pad, comprising: providing a source voltage and a pad voltage to a circuit, said circuit including a first input for receiving the source voltage; a second input for receiving the pad voltage; at least one band-limiting resistor connected to the first input and having a resistance which provides that said at least one band-limiting resistor band-limits the source voltage; at least one band-limiting resistor connected to the second input and having a resistance which provides that said at least one band-limiting resistor band-limits the pad voltage; at least one source-follower transistor connected to the first input to source-follow down the source voltage; at least one source-follower transistor connected to the second input to source-follow down the pad voltage, a comparator which receives said source voltage and said pad voltage and compares the two to determine when an over-voltage condition exists; and at least one resistor connected to the source-follower transistor which is connected to the second input and having a resistance which provides that an offset is introduced to said pad voltage before said pad voltage is provided to said comparator.

6. A method as defined in claim 5, further comprising tripping said comparator only when the pad voltage exceeds the source voltage by a value which is more then said offset which is introduced to said pad voltage.

7. A method as defined in claim 5, wherein the step of providing said source voltage to said circuit comprises providing a voltage of 3.3 volts.

8. A method as defined in claim 5, further comprising providing that each of said source-follower transistors is sized to remain in saturation with supplied biasing.

* * * * *